United States Patent
Chen et al.

(10) Patent No.: US 8,833,715 B2
(45) Date of Patent: Sep. 16, 2014

(54) CONNECTION DEVICE FOR CABLE MANAGEMENT ARM AND SLIDE ASSEMBLY

(75) Inventors: Ken-Ching Chen, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 218 days.

(21) Appl. No.: 13/417,464

(22) Filed: Mar. 12, 2012

(65) Prior Publication Data

US 2013/0233980 A1 Sep. 12, 2013

(51) Int. Cl.
*A47F 1/10* (2006.01)
*A47H 5/00* (2006.01)

(52) U.S. Cl.
USPC .......... 248/298.1; 248/235; 248/241; 211/26; 361/826; 361/727; 361/756

(58) Field of Classification Search
CPC .. A47B 88/044; A47B 96/1441; A47B 96/06; H05K 7/1489
USPC ......... 248/298.1, 235, 241, 247, 250, 225.21, 248/221.11; 211/26, 192, 187; 312/351, 312/408; 361/727, 756, 361
See application file for complete search history.

(56) References Cited

U.S. PATENT DOCUMENTS

| | | | |
|---|---|---|---|
| 6,948,691 B2 * | 9/2005 | Brock et al. | 248/222.13 |
| 6,957,877 B1 * | 10/2005 | Chiu | 312/221 |
| 7,023,708 B2 | 4/2006 | Nguyen et al. | |
| 7,473,846 B2 | 1/2009 | Doerr et al. | |
| 7,554,819 B2 * | 6/2009 | Chen et al. | 361/826 |
| 7,703,734 B2 * | 4/2010 | Chen et al. | 248/298.1 |
| 7,746,667 B1 | 6/2010 | Baiza et al. | |
| 7,798,582 B2 * | 9/2010 | Yu et al. | 312/334.4 |
| 8,403,432 B2 * | 3/2013 | Chen et al. | 312/333 |
| 2009/0014601 A1 | 1/2009 | Chen et al. | |
| 2009/0065658 A1 | 3/2009 | Chen et al. | |

* cited by examiner

*Primary Examiner* — Amy J Sterling
(74) *Attorney, Agent, or Firm* — Rosenberg, Klein & Lee

(57) ABSTRACT

A connection device for a cable management arm and a slide assembly includes a connection member, an engaging member and an insertion piece. The connection member is fixedly connected to the cable management arm and includes a passage and a window. The engaging member is fixedly connected to the connection member and has a resilient arm and an engaging portion. The resilient arm is located corresponding to the window. The insertion piece is fixedly connected to the slide assembly and has two insertion arms. One of the insertion arms has a contact section located corresponding to the engaging portion. When the insertion piece is inserted into the passage, the engaging portion of the engaging member contacts the contact section of the insertion arm to position the insertion piece to the connection member.

7 Claims, 9 Drawing Sheets

CONNECTION DEVICE FOR CABLE MANAGEMENT ARM AND SLIDE ASSEMBLY

FIELD OF THE INVENTION

The present invention relates to a connection device, and more particularly, to a connection device for a cable management arm and a slide assembly, and the connection device occupies less space and can be operated from two sides thereof.

BACKGROUND OF THE INVENTION

U.S. Pat. No. 7,473,846 to Doerr discloses a reversible cable support arm and FIG. 7 of the disclosure discloses a cable support arm 24 connected to the rails 108 and a mounting bracket 92 is connected to an end of the cable support arm. The lower portion 100 of the mounting bracket has multiple keyholes slots 94 and a plunger 98. The connection between the rails and the cable support arm is made by inserting the plungers 98, 132 to holes of the corresponding objects.

However, the plungers 98, 132 protrude beyond the chassis and which restrict the width and space when the chassis is installed in the rack. When the cable support arm is removed from the rails, the plungers provide only one removal direction. This restriction of direction, especially when the chassis is to be removed from the rack from the storage position, the restriction of the available space makes it more difficult for pulling the plungers to release the connection between the cable support arm and the rails.

The present invention intends to provide a connection device between the cable management arm and the slide assembly, wherein the connection between the cable management arm and the slide assembly can be released from two sides.

SUMMARY OF THE INVENTION

According to the aspect of the present invention, the present invention relates to a connection device for a cable management arm and a slide assembly. The connection device comprises a connection member fixedly connected to the cable management arm. The connection member comprises a pair of bent portions and a sidewall which is connected between the bent portions. A passage is defined by the bent portions and the sidewall. The sidewall has a window. An engaging member is fixed to the sidewall of the connection member and has a resilient arm and an engaging portion, wherein the resilient arm extends to the window of the connection member. An insertion piece is fixed to the slide assembly and has two insertion arms and a body which is connected between the two insertion arms. The thickness of each of the insertion arms is sized to match with the width of the passage so that the insertion arms are inserted into the passage. One of the insertion arms has a contact section located corresponding to the engaging portion. When the insertion arms of the insertion piece are completely inserted into the passage, the engaging portion of the engaging member is located between the body of the insertion piece and the contact section of the insertion arm to maintain the insertion piece to be positioned on the connection member.

Preferably, the window is a T-shaped opening and has an enlarged hole and a narrow hole which communicates with the enlarged hole. The sidewall has at least one stop which is in contact with the insertion piece to restrict the depth that the insertion piece is inserted into the connection member.

Preferably, the engaging portion extends from the insertion piece and reaches the enlarged hole of the window.

Preferably, the engaging portion has a protruding contact piece which is located corresponding to the contact section. The contact section has a contact end with which the contact piece is in contact so as to position the insertion piece by the engaging member.

Preferably, the engaging portion has a bent section located in opposite to the contact piece. The bent section is located corresponding to the insertion arm which has an inclined guiding surface with which the bent section is slidably in contact.

Preferably, a button with two faces is connected to the resilient arm of the engaging member.

According to another aspect of the present invention, the present invention provides a cable management system which comprises a cable management arm, a slide assembly and a connection device. The cable management arm comprises a first arm and a second arm which is pivotably connected to the first arm. The slide assembly has a first rail and a second rail which is slidable relative to the first rail. The connection device has a connection member fixedly connected to one of the first and second arms. The connection member has a pair of bent portions and a sidewall which is connected between the bent portions. A passage is defined by the bent portions and the sidewall. The sidewall has a window. An engaging member is fixed to the sidewall of the connection member and has a resilient arm and at least one engaging portion, wherein the resilient arm extends to the window of the connection member. The at least one engaging portion extends from the resilient arm and reaches the window. The at least one engaging portion has a bent section. An insertion piece is fixed to one of the first rail and the second rail of the slide assembly. The insertion piece has two insertion arms and a body which is connected between the two insertion arms. The insertion arms are inserted into the passage. One of the insertion arms has a contact section located corresponding to the at least one engaging portion. When the insertion arms of the insertion piece are inserted into the passage, the insertion arms contact the bent section and lift the at least one engaging portion. The contact section is moved relative to the at least one engaging portion to keep the engaging portion being supported by the contact section. The insertion piece is completely inserted into the passage and the contact section of the insertion piece does not contact the at least one engaging portion of the engaging member. The at least one engaging portion returns to an original position and contacts the contact section to stop the insertion arms from disengaging from the passage. The insertion piece is maintained to be positioned on the connection member.

Preferably, the insertion arm has an inclined guiding surface which is located corresponding to the bent section of the at least one engaging portion.

Preferably, the sidewall has at least one stop which is in contact with the insertion piece to restrict the depth that the insertion piece is inserted into the connection member.

According to a further aspect of the present invention, the present invention further provides a connection device for a cable management arm and a slide assembly. The connection device comprises a connection member which has a pair of bent portions and a sidewall which is connected between the bent portions. A passage is defined by the bent portions and the sidewall. The sidewall has a window and at least one stop. The window has an enlarged hole and a narrow hole which communicates with the enlarged hole and is located on one side of the enlarged hole. An engaging member is fixed to the sidewall of the connection member and has a resilient arm and at least one engaging portion. The resilient arm extends from the narrow hole of the window and reaches the enlarged hole. The at least one engaging portion has a bent section. An insertion piece has two insertion arms and a body which is connected between the two insertion arms. The thickness of each of the insertion arms is sized to match with the width of the passage so that the insertion arms are inserted into the passage. One of the insertion arms has a contact section located corresponding to the at least one engaging portion. The contact section has a contact end which is located corresponding to the at least one engaging portion. The insertion arm has an inclined guiding surface which is located corresponding to the bent section of the at least one engaging portion. When the insertion arms are inserted into the passage, the at least one engaging portion is lifted by the contact section and the insertion piece is completely inserted into the passage. The insertion arms contact the stop. The contact section is separated from the at least one of the engaging portion of the engaging member. The at least one of the engaging portion of the engaging member returns to its initial position thereof. The contact end of the contact section contacts the at least one engaging portion of the engaging member.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
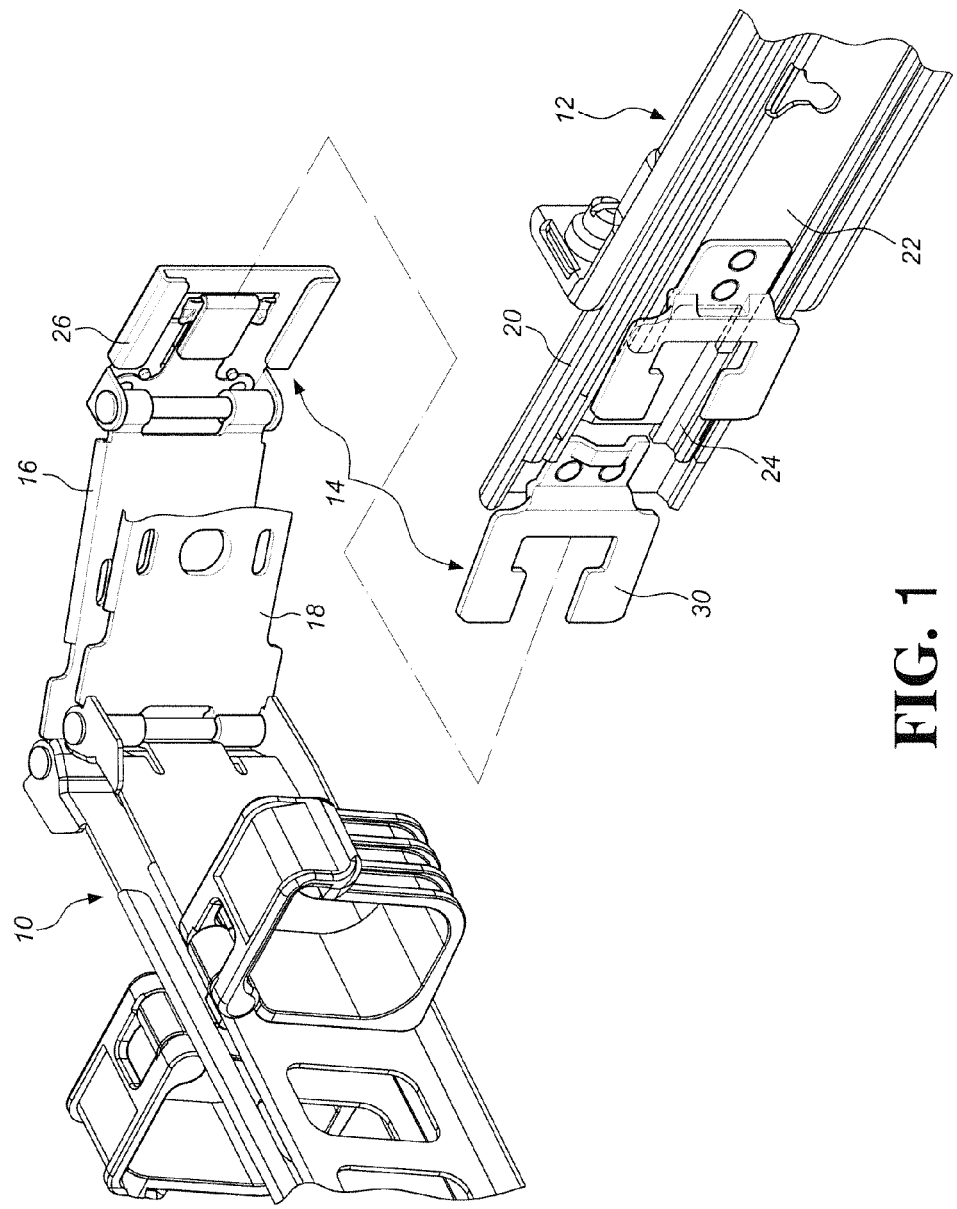
FIG. 1 shows that the connection device of the present invention is cooperated with the cable management arm and the slide assembly.

Referring to FIG. 1, the preferable embodiment of the connection device 14 of the present invention is cooperated with a cable management arm 10 and a slide assembly 12. The cable management arm 10 comprises a first arm 16 and a second arm 18 which is pivotably connected to the first arm 16. The slide assembly 12 has a first rail 20 and a second rail 22 which is slidable relative to the first rail 20. Preferably, a third rail 24 is slidably connected between the first and second rails 20, 22, so that the second rail 22 can be extended a further distance relative to the first rail 20 by the third rail 24.

Figure 2:
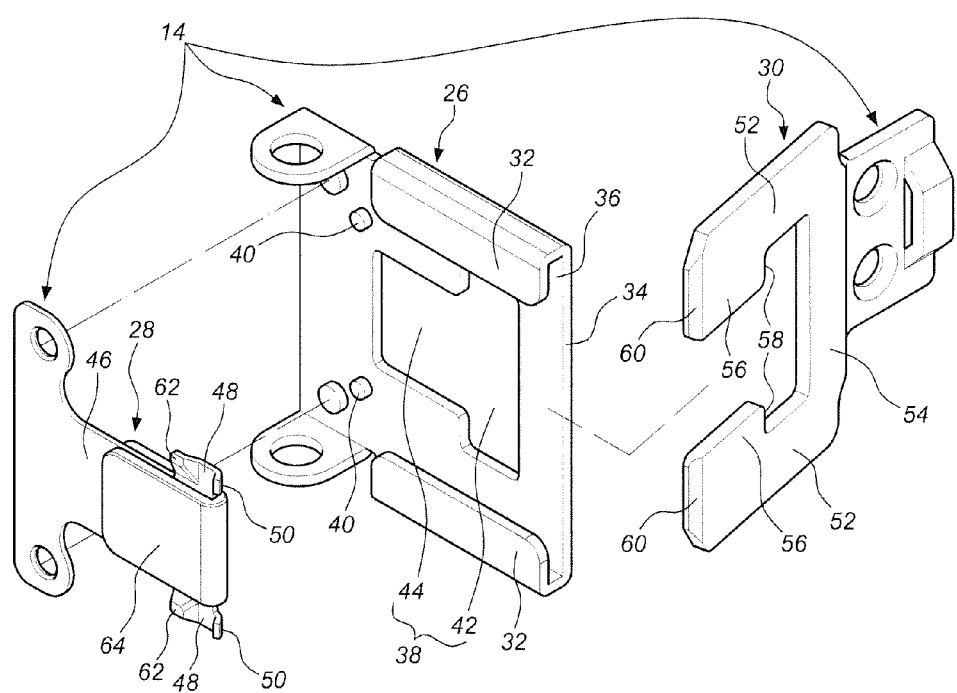
FIG. 2 is an exploded view to show the connection device of the present invention.
Figure 3:
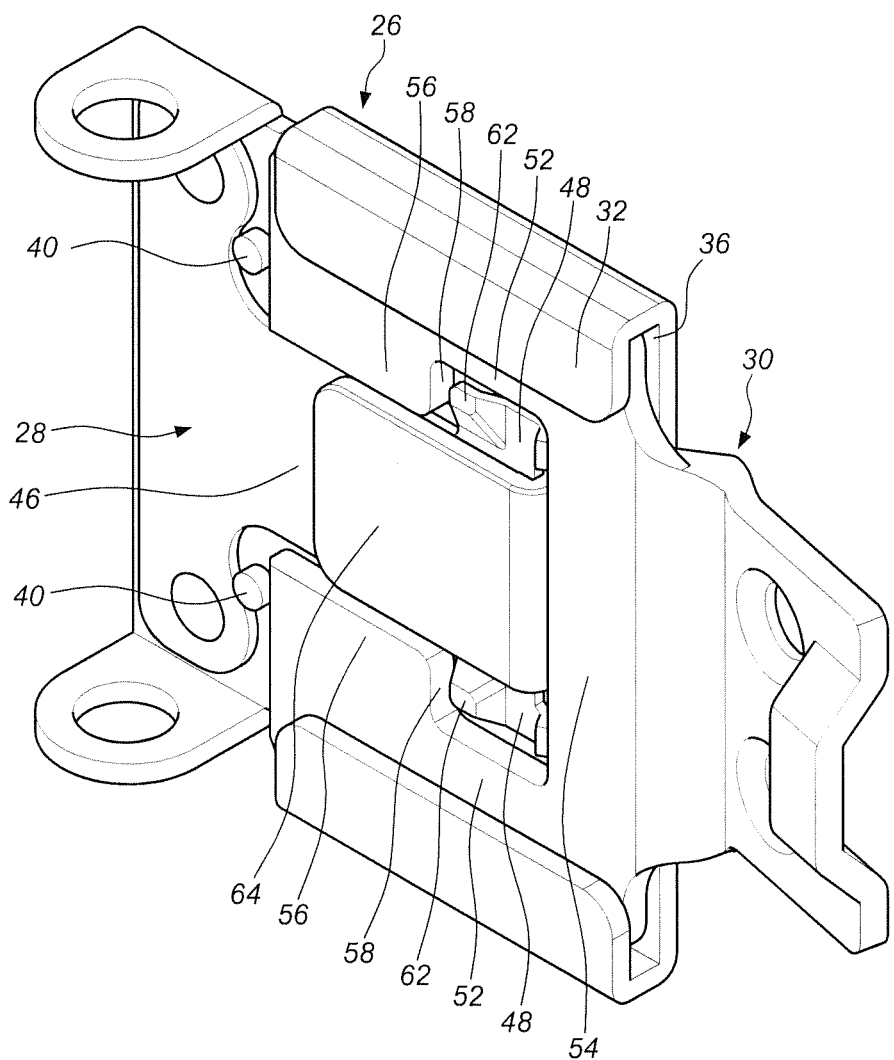
FIG. 3 shows that the connection device of the present invention.

FIGS. 2 and 3 show that the connection device 14 comprises a connection member 26, an engaging member 28 and an insertion piece 30.

The connection member 26 is fixedly connected to the cable management arm 10. As shown in FIG. 1, preferably, the connection member 26 is fixedly connected to one of the first and second arms 16, 18 of the cable management arm 10. The connection member 26 has a pair of bent portions 32 and a sidewall 34 connected between the bent portions 32. A passage 36 is defined by the bent portions 32 and the sidewall 34. The sidewall 34 has a window 38 and one or two stops 40. Preferably, the window 38 is a T-shaped opening and has an enlarged hole 42 and a narrow hole 44 which communicates with one side of the enlarged hole 42.

The engaging member 28 is fixed to the sidewall 34 of the connection member 26 and has a resilient arm 46 and an engaging portion 48 or two engaging portions 48. The resilient arm 46 extends to the window 38 of the connection member 26. In detail, the resilient arm 46 extends through the narrow hole 44 of the window 38 and reaches the enlarged hole 42. The engaging portion 48 extends from the resilient arm 46 and reaches the enlarged hole 42 of the window 38. In a preferable embodiment, the engaging portion 48 has a bent section 50.

The insertion piece 30 is fixed to the slide assembly 12. Further referring to FIG. 1, the insertion piece 30 is fixed to one of the first rail 20 and the second rail 22 of the slide assembly 12. The insertion piece 30 has two insertion arms 52 and a body 54 which is connected between the two insertion arms 52. The thickness of each of the insertion arms 52 is sized to match with the width of the passage 36 and the insertion arms 52 is inserted into the passage 36. One of the insertion arms 52 has a contact section 56 located corresponding to the engaging portion 48. In a preferable embodiment, the contact section 56 has a contact end 58. One of the insertion arms 52 or the two insertion arms 52 have an inclined guiding surface 60 which is located corresponding to the bent section 50 of the engaging portion 48. In a preferable embodiment, the engaging portion 48 has a protruding contact piece 62 which is located corresponding to the contact end 58. The bent section 50 is located in opposite to the contact piece 62 and located corresponding to one of the insertion arms 52 or the inclined guiding surface 60. A plastic button 64 with two faces is connected to the resilient arm 46 of the engaging member 28 so that the button 64 can be operated from both sides.

Figure 4:
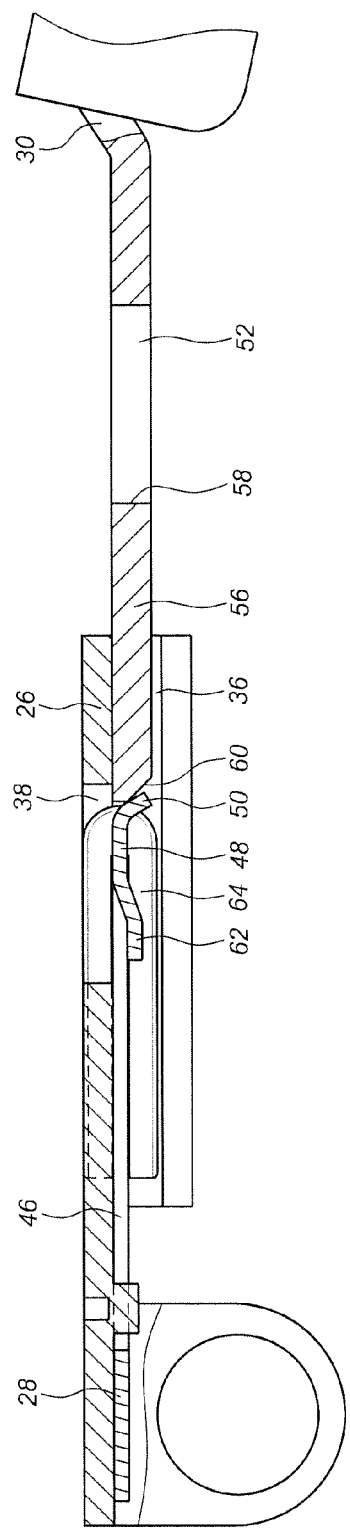
FIG. 4 shows the action that the insertion piece is inserted into the connection member.
Figure 5:
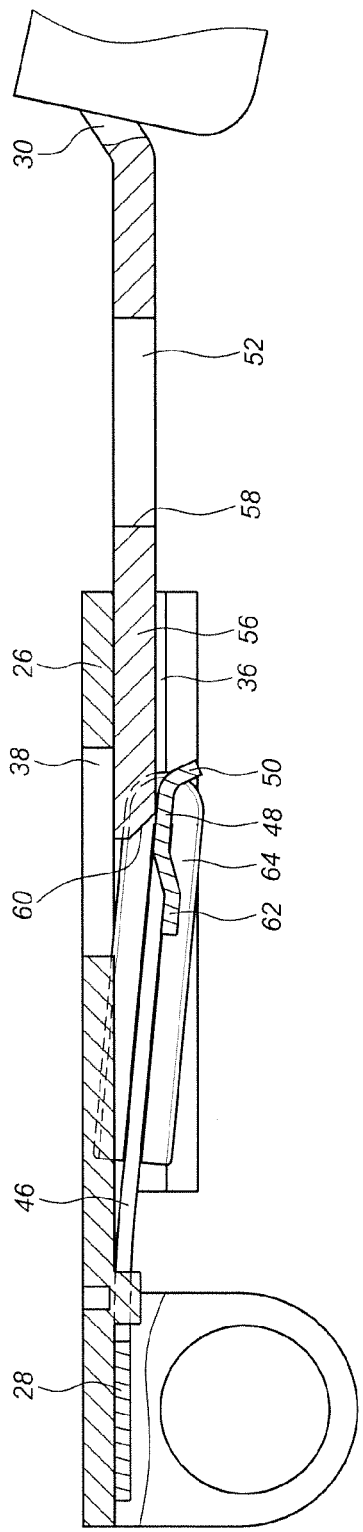
FIG. 5 shows another action that the insertion piece is inserted into the connection member.
Figure 6:
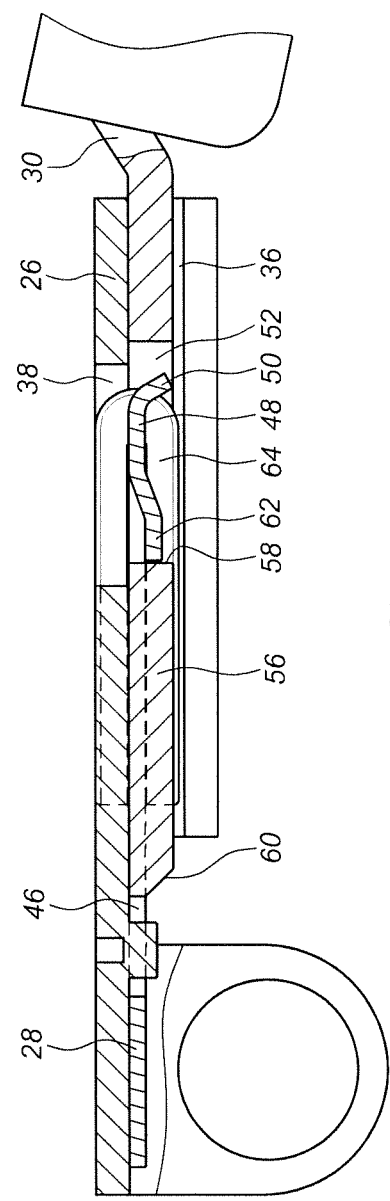
FIG. 6 shows the action that the insertion piece is engaged with the engaging member.
Figure 7:
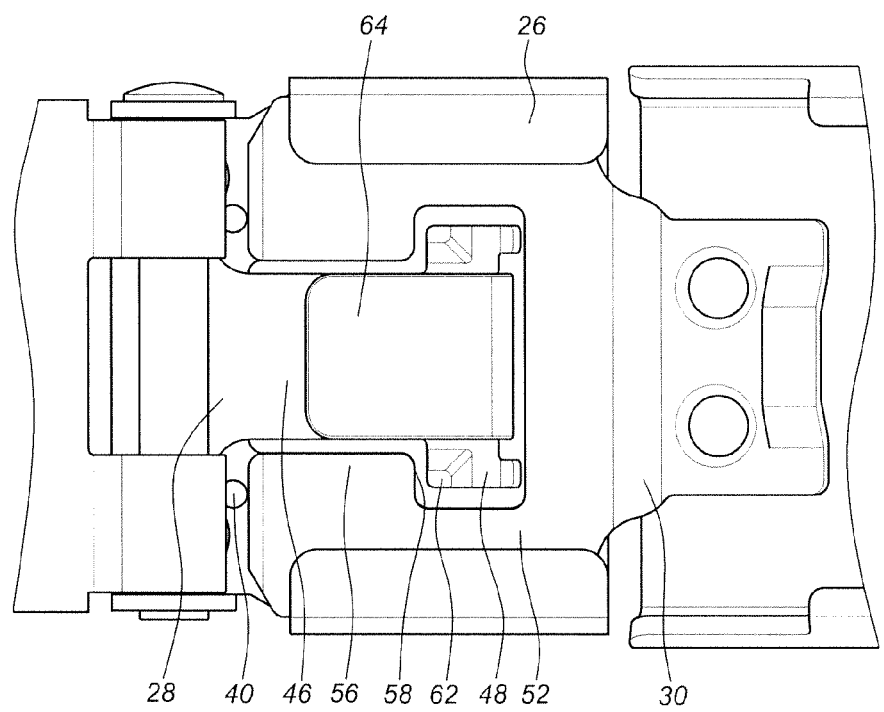
FIG. 7 shows another action that the insertion piece is engaged with the engaging member.

As shown in FIGS. 4 and 5, when the insertion arms 52 of the insertion piece 30 are inserted into the passage 36, the bent section 50 of the insertion arm 52 is guided by the inclined guiding surface 60 and pushed by the contact section 56 so that the engaging portion 48 of the engaging member 28 is in contact with the contact section 56 of the insertion arm 52 by the resilient force from the resilient arm 46. Along with the insertion of the insertion piece 30 inserted into the passage 36 and moved toward the engaging member 28, the engaging portion 48 is kept lifted by the contact section 56 until the contact section 56 of the insertion arm 52 is completely inserted into the passage 36 of the connection member 26. As shown in FIGS. 6 and 7, the engaging portion 48 is disengaged from the contact section 56 which is no longer contact with the engaging portion 48 of the engaging member 28. The resilient force from the resilient arm 46 of the engaging member 28 is released to return the engaging portion 48 to its initial position where the engaging portion 48 contacts the contact end 58 or the engaging portion 48 is located corresponding to the contact end 58. That is to say, when the connection member 26 and the engaging member 28 are pulled and separated from each other in two opposite directions, the contact piece 62 of the engaging portion 48 of the engaging member 28 stops the contact end 58 of the contact section 56 of the insertion arm 52. In this status, the engaging portion 48 of the engaging member 28 is restricted between the body 54 of the insertion piece 30 and the contact section 56 of the insertion arm 52. Therefore, the insertion arm 52 of the insertion piece 30 cannot be removed from the passage 36 of the connection member 26. The insertion piece 30 is maintained to be positioned on the connection member 26.

It is noted that the user can push the button 64 of the resilient arm 46 of the engaging member 28 to assist the insertion of the insertion arm 52 of the insertion piece 30 to the passage 36 of the connection member 26 without the help from the bent section 50 of the engaging portion 48 or the inclined guiding surface 60 of the contact section 56, the insertion piece 30 can be completely inserted into the connection member 26.

In a preferable embodiment, the insertion piece 30 can contact the stop 40 of the connection member 26 to restrict the depth of the insertion of the insertion piece 30 in the connection member 26. The engaging portion 48 of the engaging member 28 stops at the pre-set position relative to the insertion piece 30.

Figure 8:
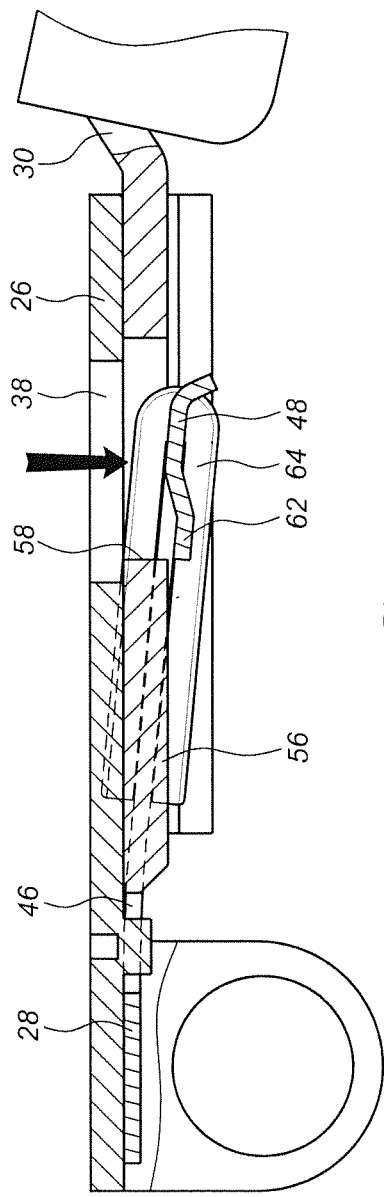
FIG. 8 shows that the insertion piece is disengaged from the engaging member, the engaging member in the status disclosed in FIG. 6 is released by being pushed in the first direction.
Figure 9:
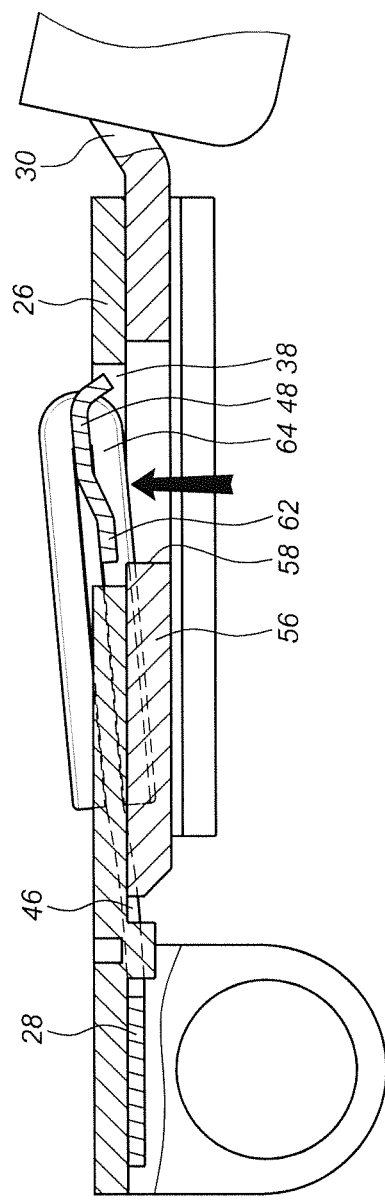
FIG. 9 shows that the insertion piece is disengaged from the engaging member and the engaging member in the status disclosed in FIG. 6 is released by being pushed in the second direction.

As shown in FIGS. 8 and 9, when removing the insertion piece 30 from the connection member 26, the user may push the button 64 of the engaging member 28 via either direction of the window 38 of the connection member 26 to operate the resilient arm 46 so that the contact piece 62 of the engaging portion 48 of the engaging member 28 does not stop the contact end 58 of the contact section 56. The insertion piece 30 can be removed from the connection member 26.

The connection device provides convenient connection between the slide assembly 12 and the cable management arm 10, especially, the user may push the button 64 of the engaging member 28 via either direction of the window 38 of the connection member 26 to release the connection between the slide assembly 12 and the cable management arm 10. The connection device uses the window to accommodate parts to reduce the parts that protrude so as to be slim and thin, and occupy less space.

While we have shown and described the embodiment in accordance with the present invention, it should be clear to those skilled in the art that further embodiments may be made without departing from the scope of the present invention.

What is claimed is:

1. A connection device for a cable management arm and a slide assembly, comprising:
  a connection member fixedly attached to the cable management arm and having a pair of bent portions and a sidewall extending between the bent portions, a longitudinal passage defined by the bent portions and the sidewall, the sidewall having a window;
  an engaging member attached to the sidewall of the connection member, the engaging member having a longitudinally projecting resilient arm and an engaging portion protruding from the resilient arm, the resilient arm extending to the window of the connection member; and
  an insertion piece fixed to the slide assembly and having two insertion arms and a body connected between the two insertion arms, a thickness of each of the insertion arms being sized to match a width of the passage, the insertion arms being detachably inserted into the passage, at least one of the insertion arms having a contact section located corresponding to the engaging portion;

wherein, when the insertion arms of the insertion piece are completely inserted into the passage, the engaging portion of the engaging member is located between the body of the insertion piece and the contact section of the insertion arm to releasably lock the insertion piece to the connection member.

2. The connection device as claimed in claim 1, wherein the window is a T-shaped opening and has an enlarged hole and a narrow hole which communicates with a side of the enlarged hole, the sidewall has at least one stop which is in contact with the insertion piece to restrict the depth that the insertion piece is inserted into the connection member.

3. The connection device as claimed in claim 2, wherein the engaging portion extends from the insertion piece and reaches the enlarged hole of the window.

4. The connection device as claimed in claim 3, wherein the engaging portion has a protruding contact piece which is located corresponding to the contact section, the contact section has a contact end with which the contact piece is in contact so as to position the insertion piece by the engaging member.

5. The connection device as claimed in claim 4, wherein the engaging portion has a bent section located in opposite to the contact piece, the bent section is located corresponding to the insertion arm which has an inclined guiding surface with which the bent section is slidably in contact.

6. The connection device as claimed in claim 1, wherein a button with two faces is connected to the resilient arm of the engaging member.

7. A connection device for a cable management arm and a slide assembly, comprising:
  a connection member having a pair of bent portions and a sidewall extending between the bent portions, a longitudinal passage defined by the bent portions and the sidewall, the sidewall having a window and at least one stop, the window having an enlarged hole and a narrow hole which communicates with a side of the enlarged hole;
  an engaging member attached to the sidewall of the connection member, the engaging member having a longitudinally projecting resilient arm and at least one engaging portion protruding from the resilient arm, the resilient arm extending from the narrow hole of the window and reaching the enlarged hole, the at least one engaging portion having a bent section; and
  an insertion piece having two insertion arms and a body connected between the two insertion arms, a thickness of each of the insertion arms being sized to match a width of the passage, the insertion arms being detachably inserted into the passage, at least one of the insertion arms having a contact section located corresponding to the at least one engaging portion, the contact section having a contact end located corresponding to the at least one engaging portion, the insertion arm having an inclined guiding surface is located corresponding to the bent section of the at least one engaging portion;

wherein, when the insertion arms are inserted into the passage, the at least one engaging portion is lifted by the contact section and the insertion piece is completely inserted into the passage with the insertion arms contacting the stop, the contact section is separated from the at least one engaging portion of the engaging member, the at least one engaging portion of the engaging member returns to an initial position thereof, and the contact end of the contact section contacts the at least one engaging portion of the engaging member, the at least one engaging portion thereby releasably locking the insertion piece to the connection member.

* * * * *